(12) United States Patent  
Yuasa et al.

(10) Patent No.: US 7,004,798 B2  
(45) Date of Patent: Feb. 28, 2006

(54) BUS BAR WITH L-SHAPED TERMINALS

(75) Inventors: Eriko Yuasa, Mie (JP); Shuji Yamakawa, Mie (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 42 days.

(21) Appl. No.: 10/658,652

(22) Filed: Sep. 9, 2003

(65) Prior Publication Data

US 2004/0048524 A1    Mar. 11, 2004

(30) Foreign Application Priority Data

Sep. 11, 2002    (JP)    ............... 2002-265762

(51) Int. Cl.  
*H01R 4/02*    (2006.01)  
*H01R 13/02*    (2006.01)

(52) U.S. Cl. ..................... 439/874; 439/891

(58) Field of Classification Search ............... 439/604, 439/606, 76.2, 83, 874, 722, 605, 276, 891  
See application file for complete search history.

(56) References Cited

U.S. PATENT DOCUMENTS

| | | | | |
|---|---|---|---|---|
| 3,719,578 A | * | 3/1973 | Berthoux et al. | ............ 204/252 |
| 5,096,768 A | * | 3/1992 | Kuromitsu et al. | .......... 428/209 |
| 5,463,251 A | * | 10/1995 | Fujita et al. | ................. 257/717 |
| 5,559,374 A | * | 9/1996 | Ohta et al. | .................... 257/723 |
| 6,264,510 B1 | * | 7/2001 | Onizuka et al. | ............ 439/876 |
| 6,787,893 B1 | * | 9/2004 | Nakajima et al. | ........... 257/687 |
| 2001/0021611 A1 | | 9/2001 | Onizuka et al. | |
| 2002/0076955 A1 | * | 6/2002 | Murakoshi | ................. 439/76.2 |
| 2004/0043645 A1 | * | 3/2004 | Yamakawa et al. | ........ 439/76.2 |

FOREIGN PATENT DOCUMENTS

| | | |
|---|---|---|
| JP | 03-074802 | 3/1991 |
| JP | 5-73859 | 10/1993 |
| JP | 07-320806 | 12/1995 |

* cited by examiner

*Primary Examiner*—Chandrika Prasad  
(74) *Attorney, Agent, or Firm*—Oliff & Berridge, PLC

(57) ABSTRACT

A bus bar, with a desired circuit configuration contained in an electrical connection box to be mounted on an automobile, has an aluminum-based metal plate punched into a desired circuit configuration to form a flat plate-like circuit body. An L-shaped terminal piece is made from a copper-based metal plate. A horizontal portion of the L-shaped terminal piece is secured to the flat plate-like circuit body by welding a conductive adhesive, riveting, or caulking so that a vertical portion of the terminal piece projects from the circuit body to form a tab.

9 Claims, 5 Drawing Sheets

BUS BAR WITH L-SHAPED TERMINALS

CROSS-REFERENCE TO RELATED APPLICATIONS

The entire disclosure of Japanese Patent Application No. 2002-265762 filed on Sep. 11, 2002 including the specification, claims, drawings and summary is incorporated herein by reference in its entirety.

FIELD OF THE INVENTION

The present invention relates to a bus bar and, more particularly, to a bus bar arranged to form an internal circuit in an electrical connection box, such as a junction box or the like, to be mounted on an automobile and made of a recyclable material.

BACKGROUND OF THE INVENTION

A bus bar, produced by punching an electrical conductive material, is contained in and forms an internal circuit in an electrical connection box, such as a junction box or the like.

For convenience of explanation, a conventional bus bar will be described by referring to FIGS. 7 and 8. FIG. 7 is an exploded perspective view of a conventional electrical connection box for an automobile. FIG. 8 is an explanatory view that illustrates a problem caused in a conventional bus bar.

More particularly, as shown in FIG. 7, an electrical connection box 1 includes a casing with an upper casing member 2 and a lower casing member 5. Bus bars 4 and insulation plates 3 are alternately laminated on each other in the casing. An end of each bus bar 4 is bent to form a tab 4a. The tabs 4a penetrate a connector containing section 2a in the upper casing member 2, a fuse containing section 2b, and a relay containing section 2c directly or through intermediate terminals. The tabs 4a are connected to a connector C coupled to a wire harness W/H, a fuse F, and a relay R.

Heretofore, the bus bars 4, constituting the internal circuits, have been made of a copper-based metal plate having high electrical conductivity. The copper-based metal plate is punched into the bus bars 4 having a desired circuit configuration. A desired end of each bus bar 4 is bent to form a tab 4a.

Recent requirements necessitate enhanced recyclability of junked automobiles. Iron makes up the largest part of an automobile. When the junked automobile is thrown into an incinerator to recover and recycle the iron, it is required that a mixing rate of copper in iron should be less than 0.1% in order to prevent the iron from being denatured due to a reaction with the copper.

Since the bus bars 4 are made of the copper-based metal plate, as described above, it is preferable to remove the bus bars 4 from the car body upon disassembly of the automobile and to separate the bus bars 4 from the car body made of an iron-based metal. However, the electrical connection box must be disassembled in order to remove the bus bars from the electrical connection box 1. This work requires extensive manpower and is not practical.

To avoid interference with iron recovery from a practical recycling standpoint, the bus bar is selected from an aluminum-based metal that will not denature the iron.

However, as shown in FIG. 8, there is a problem in the following case. A bus bar 4' is made of an aluminum-based metal. An end of the bus bar 4' is bent to form a tab 4a'. A press contact slot 4b is formed in the tab 4a'. When a terminal T of a connector C, a relay R, a fuse H or the like is forcedly pushed into the press contact slot 4b by a strong force to fit the terminal T in the slot 4b, the tab 4a' will buckle.

In view of the above problem, it is an object of the present invention to provide a bus bar that can enhance recyclability of an automobile and does not crack and buckle at a proximal part.

Still other objects and advantages of the invention will become apparent from the following specification.

SUMMARY OF THE INVENTION

In order to overcome the above problems, the present invention is directed to a bus bar that has a desired circuit configuration and is contained in an electrical connection box to be mounted on an automobile. In the bus bar, an aluminum-based metal plate is punched into a desired circuit configuration to form a flat plate-like circuit body. An L-shaped terminal piece is made of a copper-based metal plate. A horizontal portion of the L-shaped terminal piece is secured to the flat plate-like circuit body by welding, conductive adhesive, riveting, or caulking so that a vertical portion of the terminal piece stands up on the circuit body to form a tab.

It is preferable that a width of the horizontal portion of the terminal piece is the same as a width of a connection portion of the flat plate-like circuit body. However, this is not limited. The horizontal portion of the terminal piece may be secured to a part of a flat plate-like circuit body having a greater area.

According to the above construction, it is possible to reduce the mixing rate of copper to iron that has caused a problem in recovery of iron during recycling of a car body and to enhance recyclability of a junked automobile. The bus bar in the electrical connection box is made of the aluminum-based metal instead of the copper-based metal that has been used in conventional bus bars.

The terminal piece is made of the copper-based metal having hardness higher than that of the aluminum-based metal. The terminal piece can endure a fitting load exerted upon it during connection to a connector, a relay, or a fuse to the terminal piece, thereby preventing the terminal portions from buckling.

Generally, the terminal of a relay, a fuse, or the like is made of a copper alloy. The tab of the bus bar is also made of a copper-based metal that is the same kind of metal as the terminal of the mating relay or the like. Accordingly, it is possible to prevent electric erosions when the terminal of the relay or the like comes into contact with the terminal portion at the side of the bus bar.

The terminal piece may be secured to an end of the flat plate-like circuit body to project the tab from the circuit body in the same manner as a conventional bus bar. However, the terminal piece may be secured to any intermediate position of the flat plate-like circuit body to project the tab from the body, since the terminal piece is secured to the circuit body at a later process.

Thus, since the tab can project from any position other than the end on the flat plate-like circuit body, plural tabs can be provided on the same bus bar. Thus, this reduces the number of bus bars to be laminated. Heretofore, after punching out a bus bar from a metal sheet, an end of the punched bus bar is bent to form a tab. Consequently, it was impossible to provide a plurality of tabs on the same bus bar.

A press contact slot may be provided in an end of the vertical portion of the terminal piece made of the copper-based metal to form a press contact tab.

The flat plate-like circuit body made of the aluminum-based metal is bent to form a tab and a press contact slot is provided in the tab to form a press contact tab. It is impossible to bring an external terminal into contact with the opposite side edges of the press contact slot elastically, since the aluminum-based metal has no elastic function. However, the tab of the present invention can serve as a press contact tab, since the tab is made of copper-based metal.

In the case where the terminal piece is welded on the flat plate-like circuit body, it is preferable that an iron-based metal is interposed in the securing portion upon welding. Thus, if the welding material is made of the iron-based metal, it is possible to reduce mixing of a metal other than the iron-based metal in order to enhance recovery of iron.

The terminal piece may be secured to the flat plate-like circuit body through a conductive adhesive. Since a step of securing the terminal piece to the flat plate-like circuit body is only a work of applying the conductive adhesive onto the flat plate-like circuit body, efficiency of work is enhanced. Furthermore, since the conductive adhesive is interposed between different kinds of metals, that is, between the flat plate-like circuit body made of the aluminum-based metal and the terminal piece made of the copper-based metal, the conductive adhesive serves as a protective layer against electric erosions.

Alternatively, through-holes may be formed in the terminal piece and the flat plate-like circuit body. The through-holes are superimposed on each other. Rivets are inserted into the holes. The rivets are caulked to join the terminal piece and circuit body. Otherwise, one of the terminal piece and flat plate-like circuit body is provided with through-holes while the other of them is provided with protrusions corresponding to the through-holes. The protrusions may be caulked around the through-holes in a manner similar to riveting.

Furthermore, the horizontal portion of the terminal piece may be provided on the opposite sides with barrel portions. The barrel portions may be caulked on the opposite sides of the flat plate-like circuit body.

Furthermore, contact portions between the flat plate-like circuit body and the horizontal portion of the terminal are molded by a resin. The vertical portion projects from the molded portion to form the tab. After the terminal piece is put on the flat plate-like circuit body, an insulation resin may mold them together.

If water enters a jointed portion between the terminal piece and the flat plate-like circuit body made of different kinds of metals, the jointed portion will suffer from electric erosions. The above molded layer will block infiltration of water to protect against electric erosions. This enhances the electrical connection reliability. Alternatively, grease may be applied onto the contact portions between the terminal piece and the flat plate-like circuit body instead of molding of resin.

The above molded portion has a thick insulation plate section on the opposite side from the tab-projecting side of the flat plate-like circuit body. The insulation plate section is directly disposed on a lower bus bar without interposing any insulation plate between the upper and lower bus bars when laminating the bus bars.

According to the above construction, it is possible to eliminate an insulation plate that was needed for laminating the bus bars in the prior art. This reduces the number of parts, and realizes a cost cutting.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The figures are for illustration purposes only and are not drawn to scale. The invention itself, however, both as to organization and method of operation, may best be understood by reference to the detailed description, which follows taken in conjunction with the accompanying drawings in which.

DETAILED DESCRIPTION OF THE PREFERRED EMBODIMENTS

Figure 1:
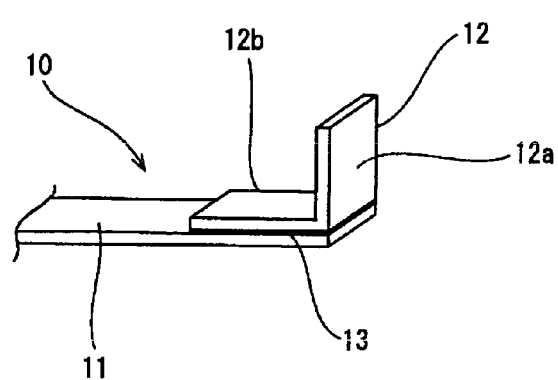
FIG. 1 is a perspective view of a main part of a first embodiment of a bus bar in accordance with the present invention.

The following description of the preferred embodiment(s) is merely exemplary in nature and is in no way intended to limit the invention, its application, or uses.

In describing the preferred embodiment of the present invention, reference will be made herein to FIGS. 1 to 6 of the drawings in which like numerals refer to like features of the invention. Features of the invention are not necessarily shown to scale in the drawings.

Figure 7:
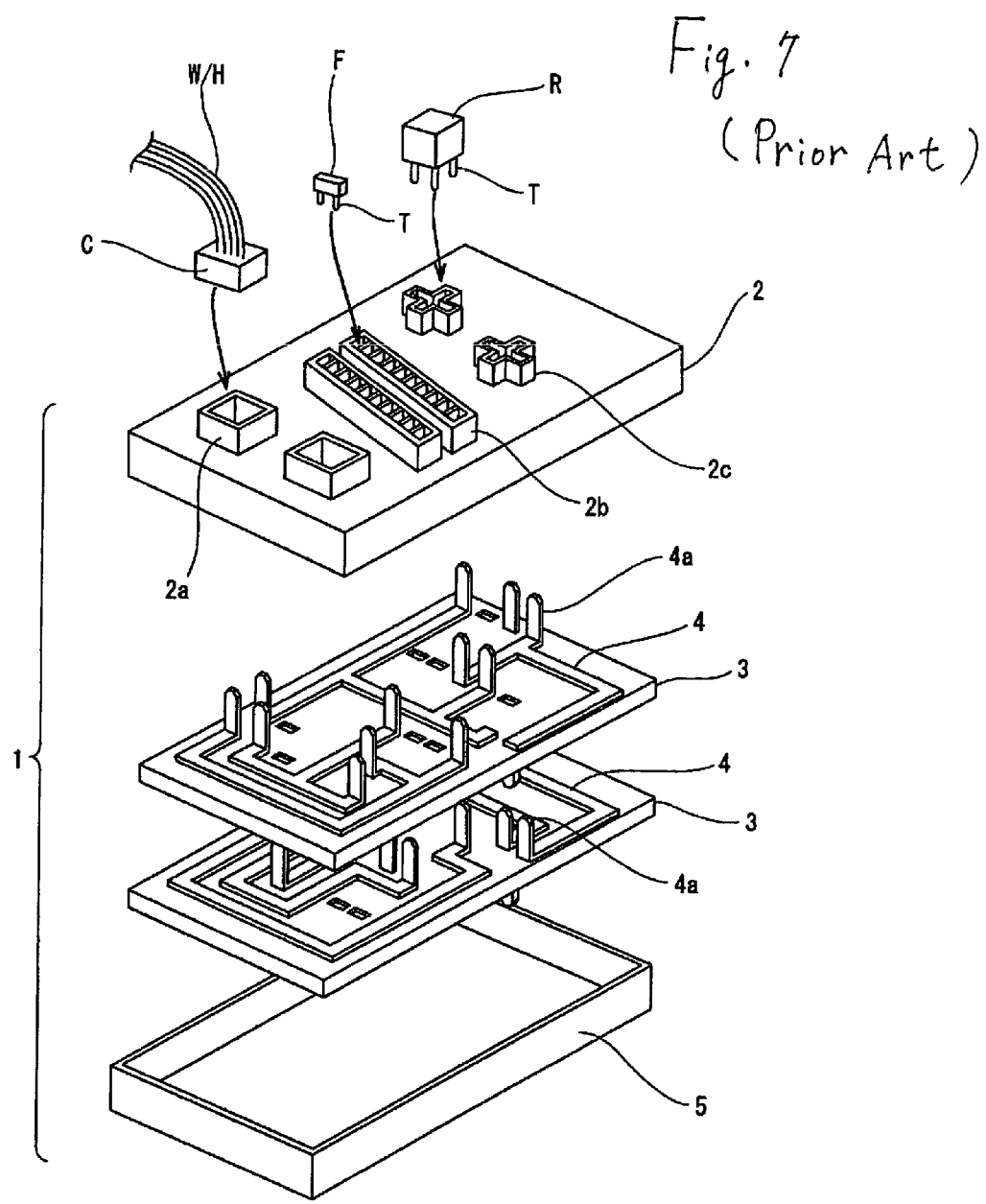
FIG. 7 is an exploded perspective view of a conventional electrical connection box for an automobile.
Figure 8:
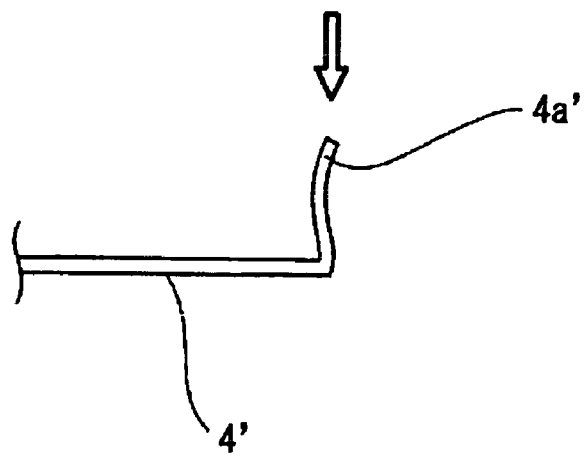
FIG. 8 is an explanatory view that illustrates a problem caused in a conventional bus bar.

Embodiments of a bus bar in accordance with the present invention will be described below by referring to the drawings. FIG. 1 shows a first embodiment of the bus bar in accordance with the present invention. A bus bar 10 shown in FIG. 1 is disposed on an insulation plate 3 to form an internal circuit in the electrical connection box 1 for an automobile shown in FIG. 7. The bus bar 10 is produced by punching an aluminum-based metal plate into a desired circuit configuration to form a flat plate-like circuit body 11.

Another L-shaped terminal piece 12 is secured to an end of the flat plate-like circuit body 11.

The flat plate-like circuit body 11 may be made of pure aluminum or an aluminum alloy, such as Al—Mg, Al—Mn, Al—Mg—Si, Al—Zn—Mg, or Al—Si. Conductivity of pure aluminum is 60% of that of copper while conductivity of an aluminum alloy is 30% of copper. It will be preferable to use pure aluminum from a conductivity viewpoint.

The terminal piece 12 includes a tab 12a bent perpendicularly from the piece 12. A securing portion 12b extends horizontally from the piece 12. The terminal piece 12 is made of a copper-based metal including copper or copper alloy. In the present embodiment, the terminal piece 12 is made of brass.

The securing portion 12b of the terminal piece 12 is put on and welded to a surface of an end of the flat plate-like circuit body 11. Thus, the tab or terminal portion 12a stands perpendicularly on the end of the flat plate-like circuit body 11. A welding material 13, made of an iron-based metal, is interposed between an upper surface of the flat plate-like circuit body 11 and a bottom surface of the securing portion 12b of the terminal piece 12.

According to the above construction, the flat plate-like circuit body 11 is made from aluminum-based metal. Only the terminal piece 12, having the tab 12a, is made from copper-based metal. Accordingly, it is possible to reduce the mixing rate of copper to iron that has caused a problem in iron recovery during recycle of car bodies and thus, this enhances recyclability of junked automobiles.

The terminal piece 12 is made from copper-based metal with a hardness higher than that of the aluminum-based metal. The terminal piece 12 can endure a fitting load and prevent the tab from buckling when the terminal piece 12 is connected to a terminal of a connector, a relay, or a fuse.

The terminals of the relay, fuse, and the like are generally made from copper-based metal while the tab 12a on the bus bar 10 is made from copper-based metal. When the relay terminal or the like is connected to the tab 12b, the same kinds of metals are brought into contact with each other. This prevents occurrence of electric erosions.

Furthermore, when the terminal piece 12 is welded to the flat plate-like circuit body 11, since the welding material 13 is made of iron-based metal, it is possible to reduce mixing of any metal other than iron which enhances iron recovery. Since aluminum neither reacts with nor denatures the iron-based metal forming the car body, it is possible to enhance iron recovery. Additionally, the flat plate-like aluminum-based metal circuit body 11 has high rust-resistance, workability, and is lightweight.

The present invention is not limited to the above embodiment. The securing portion 12b of the terminal piece 12 may be fixed on the contact surface of the flat plate-like circuit body 11 through a conductive adhesive.

In this case, after the conductive adhesive is applied on the surface of the flat plate-like circuit body 11, the securing portion 12b of the terminal piece 12 is disposed on the body 11. This will improve work efficiency. The conductive adhesive is interposed between the contact surfaces of different kinds of metals, Here, it is positioned between the flat plate-like circuit body 11, made of the aluminum-based metal, and the terminal piece 12, made of the copper-based metal. The conductive adhesive can serve as a protective layer against electric erosions.

Figure 2A:
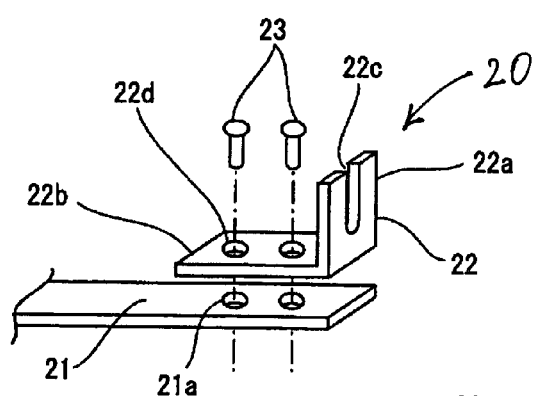
FIG. 2A is an exploded perspective view of a main part of a second embodiment of the bus bar in accordance with the present invention, illustrating a position before being assembled.
Figure 2B:
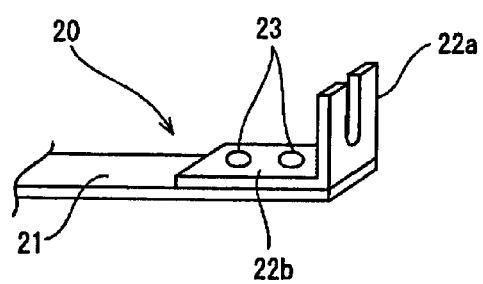
FIG. 2B is a perspective view of the main part of the second embodiment of the bus bar in accordance with the present invention, illustrating a position after being assembled.

FIGS. 2A and 2B show a second embodiment of the bus bar in accordance with the present invention.

In the second embodiment, a bus bar 20 includes a flat plate-like circuit body 21 and an L-shaped terminal piece 22.

The circuit body is produced by punching an aluminum-base metal plate into a desired circuit configuration. The terminal piece 22 is made of a copper-based metal and secured on an end of the flat plate-like circuit body 21 by rivets 23. The rivets 23 are made of a metal other than a copper-based metal, preferably, an iron-based metal to suppress mixing of copper in iron.

Two through-holes 21a are formed in the flat plate-like circuit body 21 while two through-holes 22d are formed in a horizontal securing portion 22b of the terminal piece 22. The through-holes 22d have the same diameter and interval as those of through-hole 21a. In this embodiment, a press contact slot 22c is provided in a tab 22a of the terminal piece 22 to form a press contact tab.

Figure 2C:
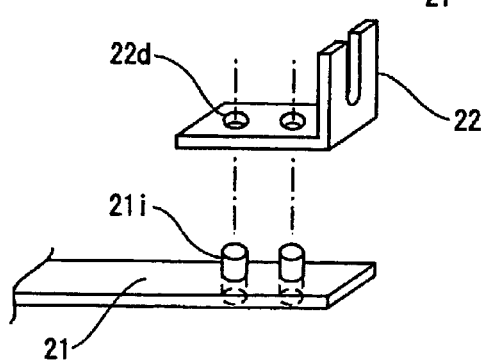
FIG. 2C is an exploded perspective view of a main part of an alteration of the second embodiment of the bus bar in accordance with the present invention, illustrating a position before being assembled.

As shown in FIG. 2C, protrusions 21i may be formed on the flat plate-like circuit body 21 by tapping the body 21. The through-holes 22d may be formed in the terminal piece 22. After the protrusions 21i are inserted into the through-holes 22d, the top ends of the protrusions 21 may be caulked.

The securing portion 22b of the terminal piece 22 is put on the surface of the flat plate-like circuit body 21 to superimpose the through-holes 21a and 22d on each other. The rivets 23 are inserted into the through-holes 21a and 22d to secure the terminal piece 22 to the circuit body 21.

Preferably, grease is applied on the contact surfaces of the flat plate-like circuit body 21 and the terminal piece 22 to cover them. This prevents water from entering a space between the contact surfaces, which, in turn, prevents electric erosions.

The press contact tab 22b of the terminal piece 22 is made from copper-based metal, which has an elastic function, instead of the aluminum-based metal, which has no elastic function. An external terminal (not shown) of a fuse, a relay, or a connector can be pushed into the press contact slot 22c in the tab 22a.

Figure 3A:
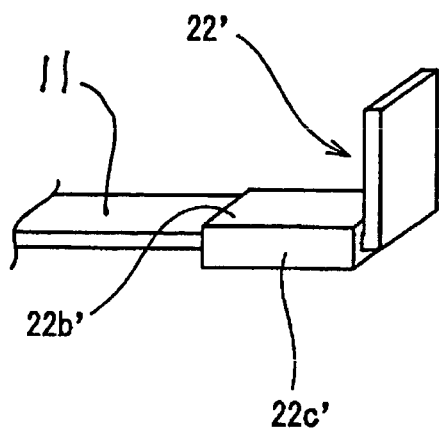
FIG. 3A is a perspective view of a main part of a further alteration of the second embodiment of the bus bar in accordance with the present invention.
Figure 3B:
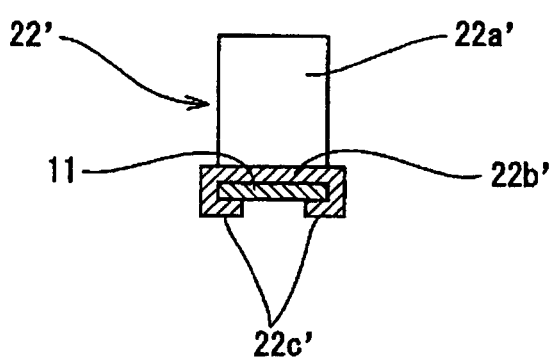
FIG. 3B is a cross sectional view of the bus bar shown in FIG. 3A.

FIGS. 3A and 3B show an alteration of the second embodiment.

In this alteration, a securing portion 22b' of a terminal piece 22' is made from copper-based metal and provided on the opposite lateral sides with barrel portions 22c'. The barrel portions 22c' are caulked onto and secured to the opposite lateral sides of the flat plate-like circuit body 11.

Figure 4:
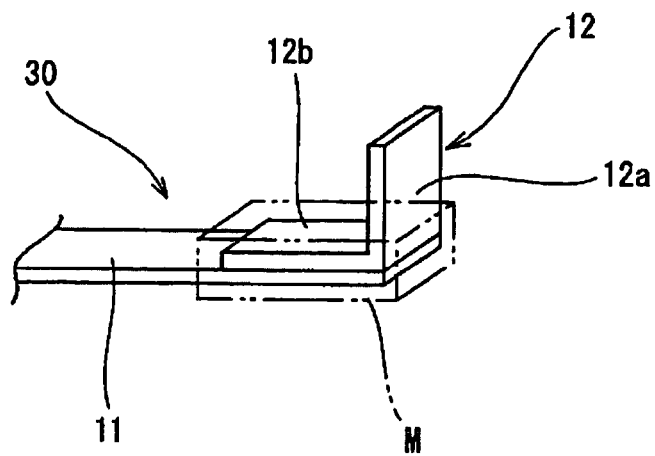
FIG. 4 is a perspective view of a main part of a third embodiment of the bus bar in accordance with the present invention.

FIG. 4 shows a third embodiment of the bus bar in accordance with the present invention.

In the third embodiment, a bus bar 30 includes a flat plate-like circuit body 11 made of the same aluminum-based metal as that in the first embodiment. A terminal piece 12 is made from copper-based metal. A securing portion 12b of the terminal piece 12 is placed directly on a surface of an end of the flat plate-like circuit body 11. An insulation resin is molded around the contact portions to form a molded portion M. A tab 12a of the terminal piece 12 projects outwardly from the molded portion M.

The terminal piece 12 and the flat plate-like circuit body 11 are made from different kinds of metals. Electric erosions will occur at the contact portions of the different kinds of metals, if water infiltrates the contact portions. However, the molded portion M prevents water from infiltrating the contact portions between the terminal pieces 12 and the flat plate-like circuit body 11. This protects the contact portions against electric erosions.

After welding the terminal piece 12, shown in FIGS. 1 to 3, to the flat plate-like circuit body 11, they may be molded by a resin material.

Figure 5:
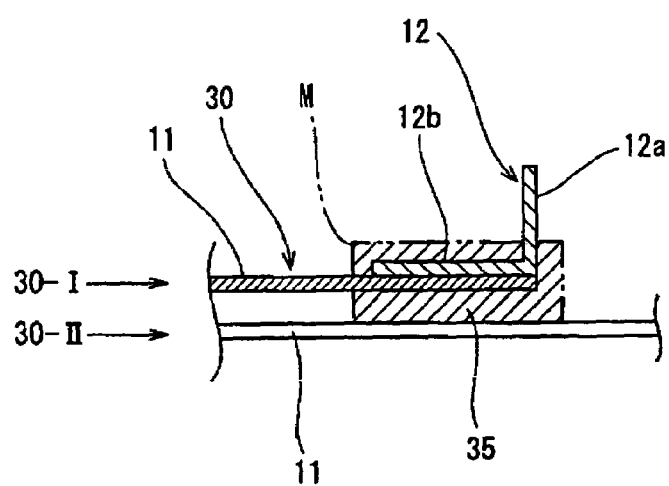
FIG. 5 is a perspective view of a main part of a fourth embodiment of the bus bar in accordance with the present invention.

FIG. 5 shows a fourth embodiment of the bus bar in accordance with the present invention.

In the fourth embodiment, the molded portion M, shown in the third embodiment, has a thick insulation plate section 35. The plate section 35 is on a side opposite from the tab-projecting side of the flat plate-like circuit body 11.

The thick insulation plate section 35 is provided on the bus bar 30. When the bus bars are piled in a multi-layer, the insulation plate section 35 of an upper stage bus bar 30-I is disposed on an upper surface of a lower stage bus bar 30-II. Consequently, an air insulation layer is defined between the upper and lower stage bus bars 30-I and 30-II. Accordingly, it is not necessary to provide an insulation plate between the upper and lower stage bus bars 30-I and 30-II.

Figure 6:
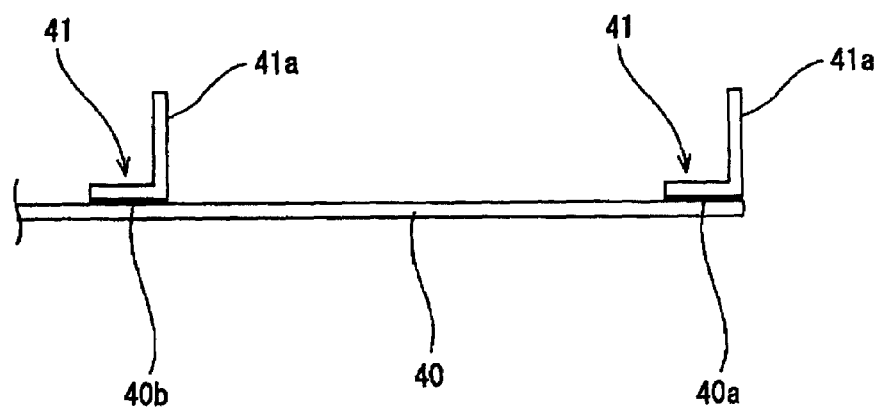
FIG. 6 is a perspective view of a main part of a fifth embodiment of the bus bar in accordance with the present invention.

FIG. 6 shows a fifth embodiment of the bus bar in accordance with the present invention.

In the fifth embodiment, terminal pieces 41 are made from copper-based metal. The terminal pieces 41 are fixed on an end 40a and an intermediate portion 40b of a flat plate-like circuit body 40. The circuit body is made from aluminum-based metal.

Heretofore, the tab was formed by bending. Consequently, the tab could not be formed on an intermediate portion of a conventional flat plate-like circuit body. However, in the fifth embodiment, tab 41a can project from any position on the flat plate-like circuit body 40. This is possible since the terminal piece 41 is secured on the flat plate-like circuit body 40 in a later process.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

What is claimed is:

1. A bus bar having a desired circuit configuration and to be contained in an electrical connection box to be mounted on an automobile, comprising:
   an aluminum-based metal plate punched into a desired circuit configuration to form a flat circuit body;
   an L-shaped terminal piece made from copper-based metal plate; and
   a horizontal portion of said L-shaped terminal piece secured to said flat circuit body so that a vertical portion of said terminal piece projects from said body forming a tab,
   wherein the horizontal portion of said L-shaped terminal piece is directly, and electrically conductively, connected to the aluminum-based metal plate.

2. A bus bar according to claim 1, wherein contact portions between said flat circuit body and said horizontal portion of said terminal piece are molded by a resin so that said vertical portion projects from said molded portion.

3. A bus bar having a desired circuit configuration and to be contained in an electrical connection box to be mounted on an automobile, comprising:
   an aluminum-based metal plate punched into a desired circuit configuration to form a flat circuit body;
   an L-shaped terminal piece made from a copper-based metal plate;
   a horizontal portion of said L-shaped terminal pieces secured to said flat circuit body by molding a resin onto contact portions between said terminal piece and said circuit body and a vertical portion of said terminal piece projects from said circuit body to form a tab,
   wherein the horizontal portion of said L-shaped terminal piece is directly, and electrically conductively, connected to the aluminum-based metal plate.

4. A bus bar according to claim 3, wherein said molded portion has a thick insulation plate section at an opposite side from a tab-projecting side of said flat circuit body, said insulation plate section directly disposed on a lower bus bar without interposing any insulation plate between the upper and lower bus bars when laminating said bus bars.

5. A bus bar according to claim 1, wherein said terminal piece is provided in an end with a press contact slot to form a press contact tab.

6. A bus bar according to claim 1, wherein said terminal piece secured to an end or any intermediate position on said flat circuit body.

7. A bus bar according to claim 3, wherein said terminal piece is provided in an end with a press contact slot to form a press contact tab.

8. A bus bar according to claim 3, wherein said terminal piece secured to an end or any intermediate position on said flat circuit body.

9. A bus bar according to claim 1, wherein the horizontal portion of said L-shaped terminal piece is secured to said flat circuit body by welding, a conductive adhesive, a fastener, or caulking.

* * * * *